United States Patent [19]
Porter

[11] 3,999,046
[45] Dec. 21, 1976

[54] DATA ACQUISITION SYSTEM

[76] Inventor: John P. Porter, 3028 W. Bailey Road, Cuyahoga Falls, Ohio 44221

[22] Filed: Apr. 17, 1975

[21] Appl. No.: 569,095

Related U.S. Application Data

[63] Continuation-in-part of Ser. No. 532,937, Dec. 16, 1974, Pat. No. 3,951,389, which is a continuation of Ser. No. 307,583, Nov. 17, 1972, abandoned.

[52] U.S. Cl. .................. 235/151.1; 235/151.3; 259/192; 259/DIG. 19
[51] Int. Cl.² .................. G06F 15/46; B29B 1/04
[58] Field of Search ............ 235/151.12, 151.13, 235/151.3, 151.31, 151.1; 259/154, 191, 192, DIG. 19; 324/142

[56] References Cited
UNITED STATES PATENTS

| | | | |
|---|---|---|---|
| 2,595,373 | 5/1952 | Stewart | 324/142 |
| 3,237,241 | 3/1966 | Gagliardi | 259/192 |
| 3,447,201 | 6/1969 | Seanor et al. | 259/191 |
| 3,456,599 | 7/1969 | Baker | 259/191 |
| 3,727,894 | 4/1973 | Ahrenberg | 259/154 |
| 3,841,147 | 10/1974 | Coil et al. | 235/151.3 |

*Primary Examiner*—Jerry Smith

[57] ABSTRACT

The data acquisition system disclosed herein serves to monitor and record various parameters of a mixer employed in an elastomer processing system. During each mixing operation, the elastomer compound identification and batch number are recorded. This information is then followed by periodic recordings of the concurrent values of real time, the temperature of the elastomer and the work performed, in terms of the amount of energy consumed to work the elastomer. The recording intervals take place in response to sensing such conditions as work chamber door closed, ram down, ram floating, and door open.

18 Claims, 6 Drawing Figures

DATA ACQUISITION SYSTEM

This is a continuation-in-part of my previous United States patent application, Ser. No. 532,937, filed on Dec. 16, 1974 and now U.S. Pat. No. 3,951,389 and which, in turn, is a continuation of my now abandoned United States patent application, Ser. No. 307,583, filed on Nov. 17, 1972.

This invention relates to data acquisition and, more particularly, to monitoring and recording various parameters of an operating mechanism. More particularly the invention is directed to monitoring the operation of a mixer, such as an elastomer processor, and providing a record of the values of various operating parameters at certain intervals in an operating cycle.

In the preparation of uncured elastomer for use in manufacturing tires, hose, belts and other articles of reinforced or unreinforced elastomer, the elastomer has various substances incorporated therein during a mixing process to provide desired properties. The mixing requires that the elastomer be mechanically worked, as in a Banbury mixer or other mixing apparatus, with additional ingredients added at various intervals during the mixing cycle. Difficulties have been encountered in obtaining uniform characteristics of such mixtures from batch to batch. This has resulted from uncertainties in how long a batch should be worked and at what points in a mixing cycle should the various ingredients be added.

One criteria used in determining when to add ingredients or how long to work the compound is the temperature of the compound being worked. This is somewhat inexact due, in large measure, to the difficulty of accurately measuring the temperature of the compound as it is being worked. Another criteria employed as to when additional ingredients are to be added has been based on the length of time working has taken place. This, however, has not proved satisfactory since various elastomers respond differently to working and small differences in timing may be significant. Moreover, depending upon the combination of the ingredients added to an elastomer, the length of time of working that should be required before the addition of another ingredient may vary. Another criteria employed in determining when to add ingredients to an elastomer during the working operation has been based on determining the amount of power consumed by the working apparatus and then adding ingredients in dependence upon the amount of power consumed.

It has been found desirable to provide a record of the aforementioned criteria or parameters (work performed, temperature, and time) during the working operations from batch to batch so as to provide a detailed mixing history. Such information will provide ready indentification of improperly mixed batches. Moreover, mixing rates for black oil, or other ingredients can be determined from such a mixing history. Also, if the mixing history includes information as to both elasped time and the amount of energy consumed during a mixing operation, then information is available to determine the cost of a particular mixing specification compared to another mixing specification for a particular compound. Also, such a mixing history would permit identification so as to quantify the "first batch effect", which may be defined as the time necessary to reach thermal stability.

SUMMARY OF THE INVENTION

It is therefore a primary object of the present invention to monitor and record various operating parameters, such as time, temperature, and consumed energy (work) at various intervals during a working cycle.

It is a still further object of the present invention to provide a mixing history of an internal mixer so that improperly mixed batches may be readily identified.

It is a still further object of the present invention to monitor and record various operating parameters of a mixer so that mixing rates for various ingredients may be readily determined.

It is a still further object of the present invention to monitor and record elapsed time and energy required to perform a mixing operation so that the cost for mixing a particular compound may be readily identified.

It is a still further object of the present invention to monitor and record various operating parameters of a mixer in a manner such that one may identify and quantify the "first batch effect".

The data acquisition system and method practiced herein contemplates the provision of apparatus for processing elastomer or the like and which apparatus includes working means for mechanically working the elastomer. Moreover, it is contemplated that an electrically energized drive mechanism serves to drive the working means in such a manner that electrical energy is expended as work is performed on the elastomer.

In accordance with the present invention, the amount of work performed is determined as a function of the expended electrical energy as the elastomer is being worked and an electrical work signal is provided having a magnitude which varies in accordance with the expended electrical energy. The temperature of the material being worked is sensed and an electrical temperature signal having a value in accordance with the temperature is provided. An output reading is periodically provided during a working cycle respecting the then concurrent values of expended work and the temperature.

In accordance with a more limited aspect of the present invention, the readout is provided at various intervals during a working cycle with each readout including the then concurrent values of expended work, temperature and time.

In accordance with a still further aspect of the present invention a permanent record is made including information pertaining to compound and batch number and for each batch there is provided a plurality of readouts taken at various intervals within the work cycle with each such readout including information pertaining to the then concurrent values of time, work, and temperature.

In accordance with a still further aspect of the present invention as discussed in the paragraph immediately above, there is also provided readouts at other intervals such as work cycle starting point and a work cycle ending point.

BRIEF DESCRIPTION OF THE DRAWINGS

The foregoing and other objects and advantages of the invention will become more readily apparent from the following description of the preferred embodiment of the invention as taken in conjunction with the accompanying drawings, which are a part hereof, and wherein.

DESCRIPTION OF THE PREFERRED EMBODIMENT

The preferred embodiment of the data acquisition system is described herein in conjunction with monitoring and recording the operating parameters of an internal mixer capable of mixing elastomer compounds. One suitable internal mixer is known as a Banbury mixer and is conventional in the art. Such a mixer is illustrated in FIGS. 1 and 2 and will be described herein to the extent necessary to facilitate an understanding of the present invention.

Figure 1:
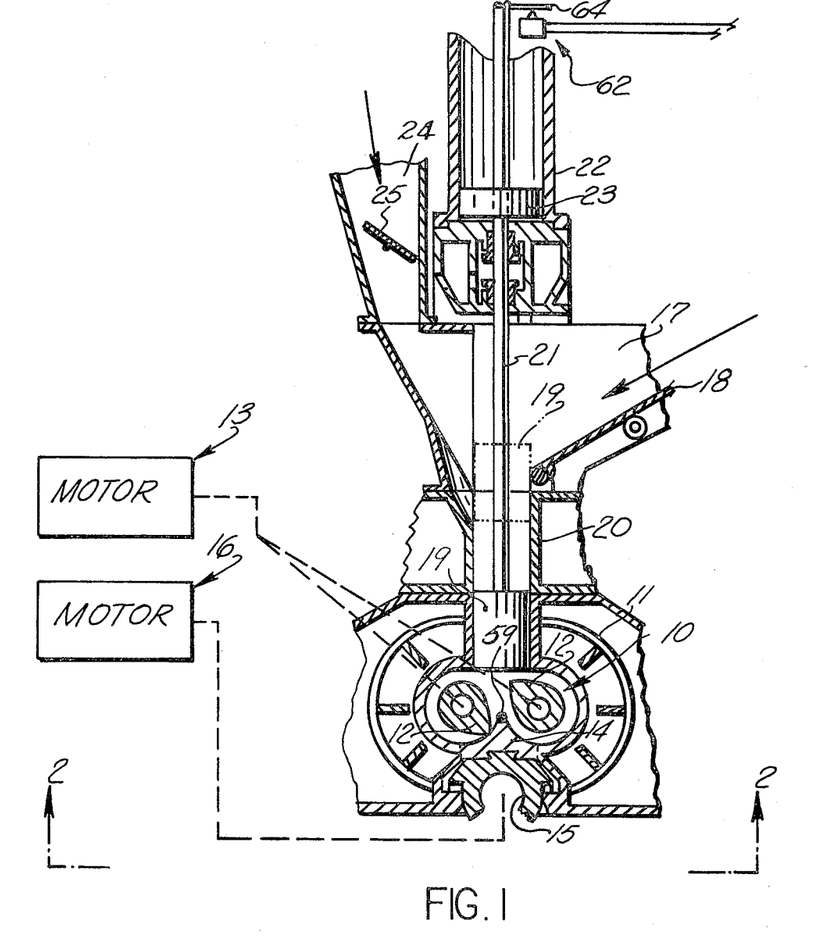
FIG. 1 is a fragmentary sectional view taken vertically through an electrically driven elastomer mixing apparatus.
Figure 2:
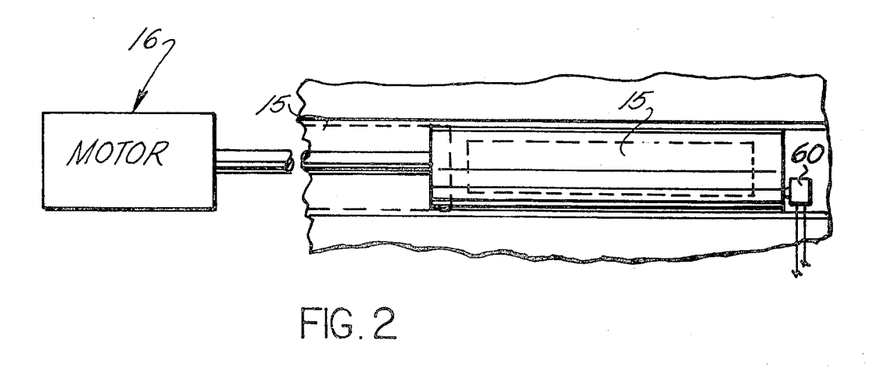
FIG. 2 is a fragmentary sectional view taken generally along line 2—2 looking in the direction of the arrows in FIG. 1.

Referring now to FIG. 1 of the drawings, the mixing apparatus shown comprises a mixing chamber 10 which is surrounded by a heating jacket 11 to permit the circulation of water or other fluid for controlling the temperature of the materials being mixed in the chamber 10. Within the chamber 10 are a pair of rotors 12 which are revolved in opposite directions by an electrical motor 13. The lower portion of the mixing chamber 10 is provided with a ridge 14 which forms a part of the closure member 15 for the bottom of the mixing chamber. The closure member may be slid, perpendicularly to the plane of the drawing, to open the lower portion of the mixing chamber and thus effect discharge of material contained therein. The ridge 14, when the closure member is in the position shown in FIG. 1, cooperates with the rotors 12 to assist in the mixing operation. The ridge 14 and the member 15 on which it is mounted are movable between open and closed positions under control of an electrical motor 16.

The materials to be mixed are introduced into the chamber 10 through a load opening 17 which has a movable wall 18. The apparatus also incorporates a pressure ram 19, or floating weight, for imposing pressure upon the material in the mixing chamber. This ram is mounted in a stack or guideway 20 communicating with and extending upwardly from the upper portion of the mixing chamber 10. The ram 19 is moved vertically by a piston rod 21 which extends into a cylinder 22 and is connected therein to a piston 23. The cylinder 22 is provided with the usual ports for introduction and exhaust of fluid pressure to effect movement of the ram or weight 19 from the full line position shown in FIG. 1 to an elevated position to thereby provide space therebeneath for the introduction of materials through the opening 17. The apparatus is also shown as provided with a gas and dust exhaust passage 24 provided with a suitable valve 25.

It will be readily understood by those skilled in the art that the mixing or compounding of an uncured elastomer is effected in the apparatus as shown in FIG. 1 by elevating the weight or ram 19 to the upper position and disposing the movable wall 18 of the load opening 17 in the position shown in FIG. 1. The elastomer is then introduced through the opening 17 into the mixing chamber where it is subjected to mechanical working by the rotors 12 as these are driven by the motor 13. The material is confined in the mixing chamber by the ram or weight 19 disposed in its lower position as shown.

After the elastomer has been worked to an appropriate extend the other ingredients are added at intervals by sequentially moving the ram or weight 19 to its upper position and disposing the wall 18 in a location such that the ingredients may be introduced through opening 17. This opening may then be closed and the ram lowered for effecting mixing of the added ingredients into the elastomer. The addition of materials is generally effected while the rotors 12 remain in operation and it is frequently desirable to effect the initial mixing of an added ingredient or ingredients to the elastomer for a short interval of time before the weight or ram 19 is moved from its upper to lower position for completion of that portion of the mixing; this operation being known as a "roll" of the materials in the mixing chamber.

Upon completion of the desired mixing cycle the closure member 15, which covers the discharge opening, is moved by the motor 16 to an open position while the mixing motor 13 of the apparatus continues the rotation of the rotors 12 so that the material is discharged from the chamber 10 and the walls thereof are purged of the mixed material. After discharge is completed the discharge opening is closed and a new cycle is initiated.

In accordance with the present invention various operating parameters of the internal mixer are monitored and a permanent record of the data is made by providing readouts at various intervals during a mixing cycle. These parameters include real time, temperature of elastomer, and the work expended during a mixing cycle. The values of these parameters are recorded at intervals in the mixing operation for each batch of a compound with the recording intervals taking place in response to the detection of certain events.

Figure 3:
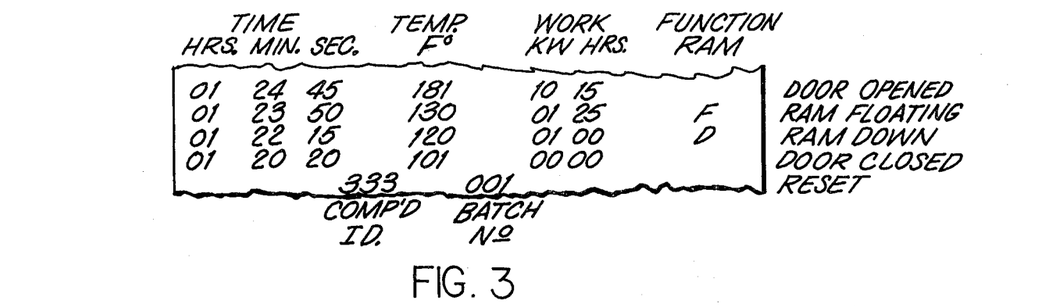
FIG. 3 is an illustration of a portion of a readout tape obtained in accordance with the invention.

Reference is now made to FIG. 3 which illustrates a portion of a readout in the form of a printed paper tape. The information is printed line by line on the tape from the bottom line and then at intervals to the top line. At a start or reset condition a legend is printed indicative of the compound identification, in this case 333. On the same line as the compound identification there is provided the batch number, in this case 001. Having identified the compound and batch number on the permanent record, the first data recording takes place in response to a sensor noting that the door 15 (FIGS. 1 and 2) is closed. The data printed includes the then concurrent values of real time, the temperature within the working chamber and the work performed. As will be described in greater detail hereinafter, the work performed is expressed in terms of the kilowatt hours of electricity expended by motor 13 in driving the rotors 12 during the mixing cycle. Thereafter, periodic recordings are made in response to sensing whether the ram 19 is in a down position (as shown in solid lines in FIG. 1) or is in a floating condition (as indicated by the dotted lines in FIG. 1).

During a mixing cycle, there may be several times that the ram is in a down condition or in a floating condition, depending upon the number of ingredients that are added during the mixing cycle. Whenever the ram is in a down condition a readout is provided in terms of a printed line of text including real time, the temperature in the work chamber, and the work performed. In addition, a designation "D" is printed on the same line of text to indicate that this reading was taken when the ram was in a down condition. A readout is also provided whenever ram condition changes from a ram down condition to a ram floating condition. Again, the readout includes the then concurrent values of real time, temperature and work performed. Also the readout includes a designation "F", indicative that that readout took place when the ram was in a floating condition.

The last readout for a given cycle is in response to a door open condition. Thus, whenever motor 16 drives the door 15 to an open condition so as to dump the contents from the working chamber, a door open condition is defined. The readout for this condition includes the then concurrent values of real time, temperature and work. As will be brought out in greater detail hereinafter, each time the door is opened a command is generated whereby the batch number indication is updated by factor of 1 so that the recording sequence just described will be repeated for a second batch with the first recording showing the compound identification number 333 and the new batch number 002 and so on. Moreover, it is desirable that the mechanism for providing the printout of FIG. 3 use a different colored ink for printing the compound identification and batch number than that for the remaining data. The compound and batch number readout is printed in red ink whereas the other readouts are printed in black ink.

Having now described the preferred readout and its format with respect to FIG. 3, a preferred embodiment of apparatus and method for obtaining the printout will now be described in conjunction with FIGS. 4 through 6.

Figure 4:
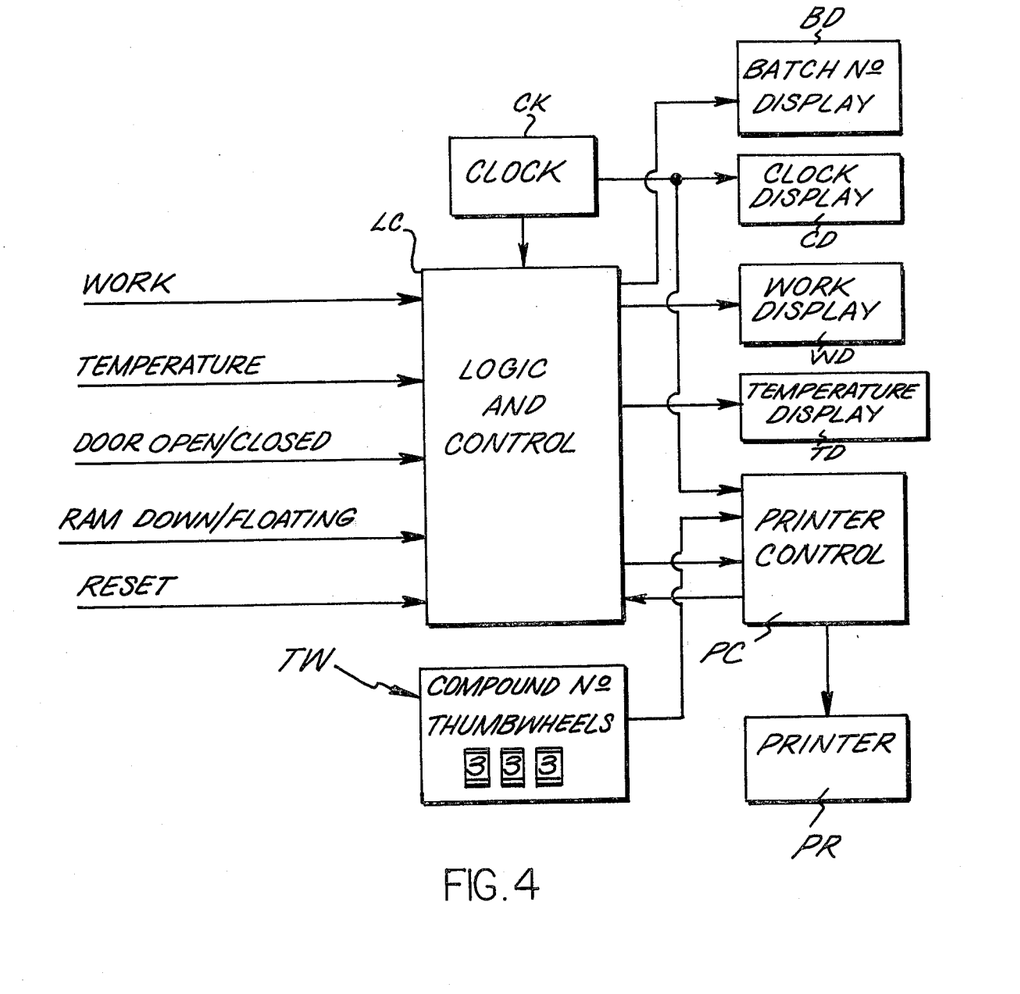
FIG. 4 is a block diagram illustration of the data acquisition system.

The data acquisition system may be generalized as indicated by the block diagram of FIG. 4, to which attention is now directed. A more detailed description will be presented with reference to FIGS. 5 and 6. As shown in FIG. 4 the system includes a logic and control circuit LC which receives inputs having values respectively representative of the amount of work performed thus far in a cycle of operation, the temperature of the material being worked, the condition of the door 15 as being in either an open or closed condition, the condition of ram 19 as to whether it be in a down or a floating condition and a reset input (initiated by an operator to commerce the recording function). The compound number to be printed (for example compound No. 333 in FIG. 3) is entered by means of an operator adjusting each wheel of a three-digit thumb wheel switch to the desired number (in this case 333). The thumb wheel TW is of conventional design and each wheel includes numerical digits thereon to provide a visual display of the entered number. A coded output signal in BCD format is supplied to a printer control circuit PC which operates a mechanical printer to print the entered number in decimal digits. The logic control circuit in response to a reset input signal provides a coded signal to the printer control PC to print batch No. 1 in the format 001, as is shown in FIG. 3.

Figure 6:
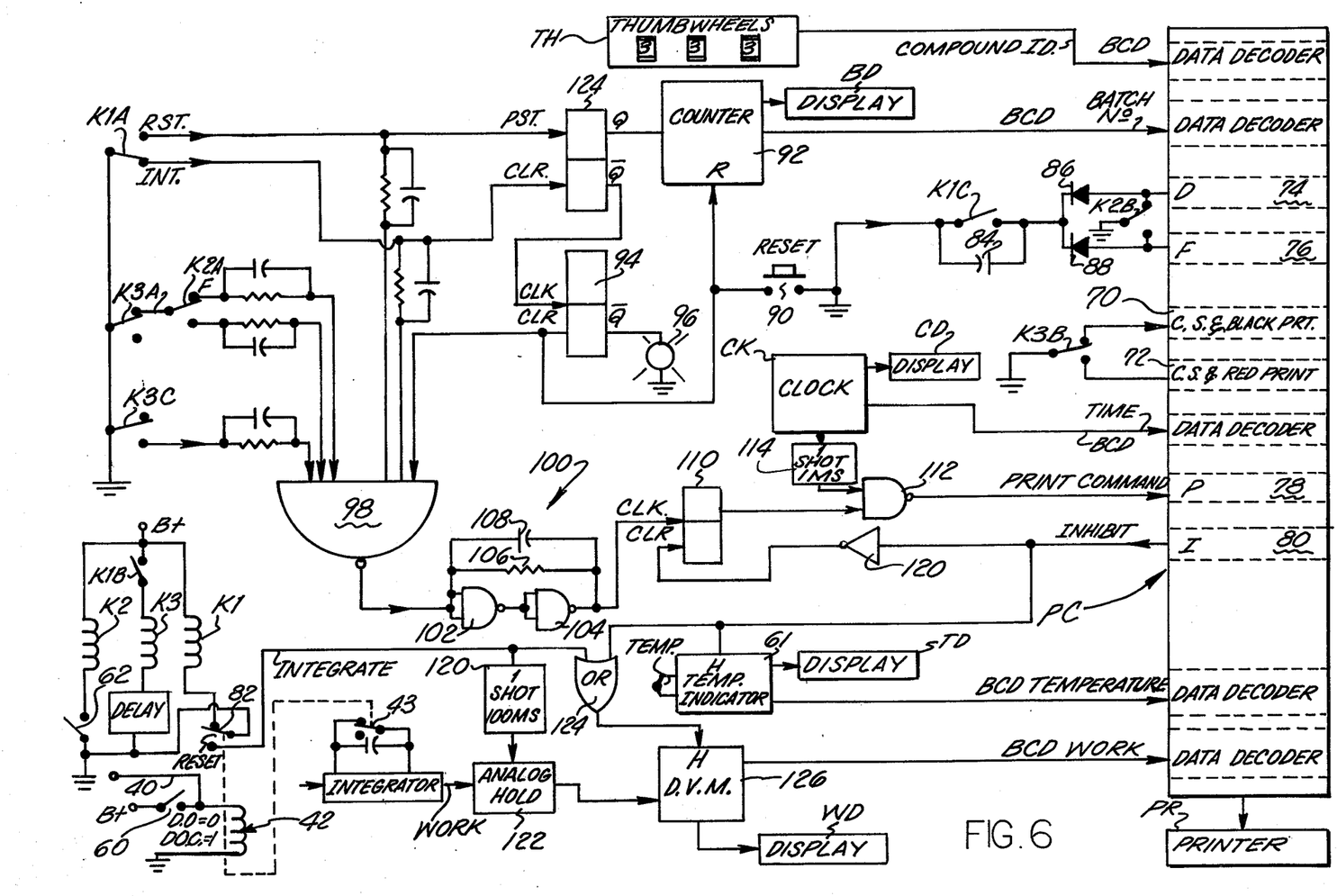
FIG. 6 is a combined schematic-block diagram illustration of the data acquisition system.

As will be brought out in greater detail with reference to FIG. 6, the printer control PC operates the printer PR to periodically provide printouts in response to the aforementioned sensed conditions of the ram and the door. During each readout interval, the logic control circuit provides BCD data to the printer control representative of the then concurrent values of temperature, work and real time. In addition to the permanent record printout provided by the printer PR at various work cycle intervals, various of the sensed conditions are visually displayed so as to be visually monitored by an operator. The visual displays include a batch number display BD, a clock display CD, a temperature display TD, and a work display WD.

Figure 5:
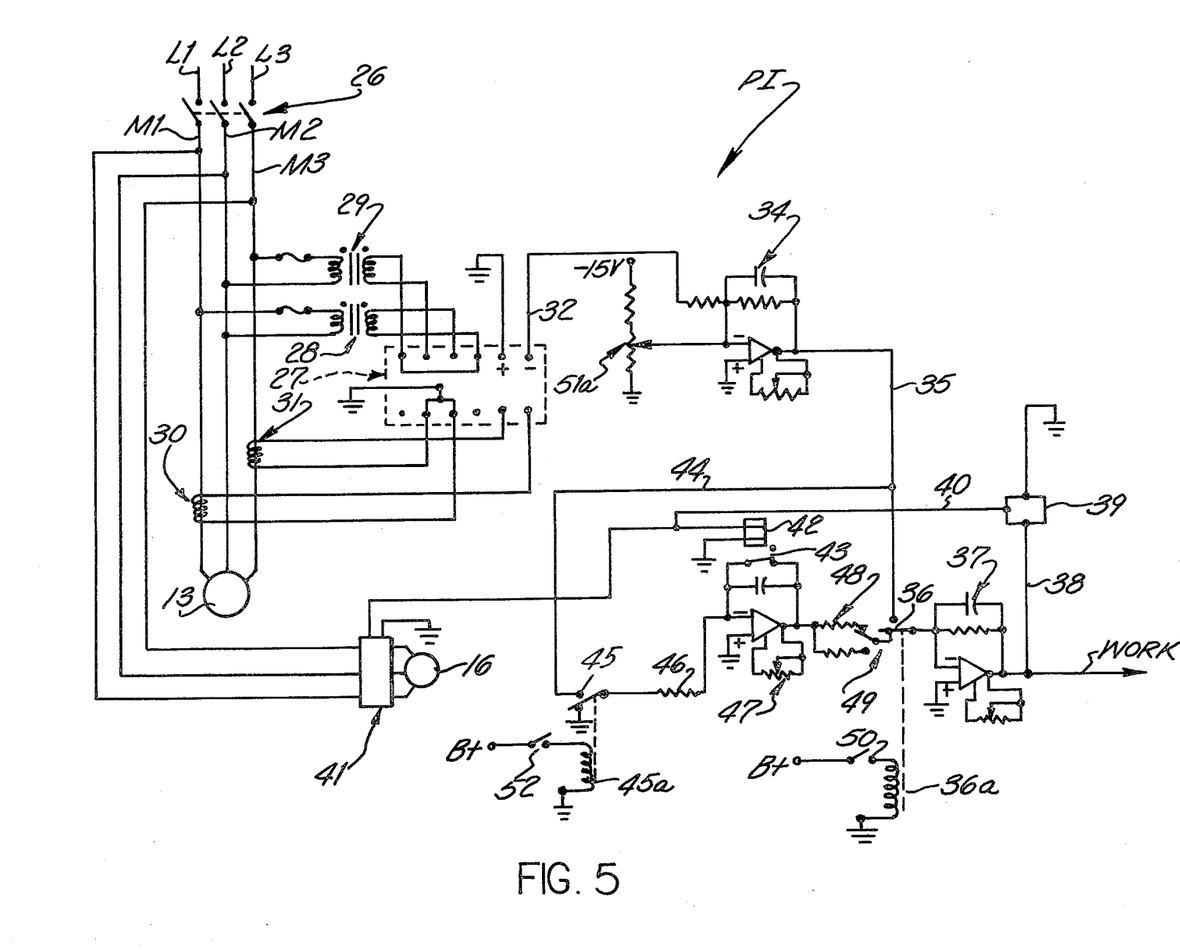
FIG. 5 is a combined schematic diagram illustration of the circuitry employed for electrically energizing various driving motors and for monitoring power expended in operating one of the motors.

Reference is now made to FIG. 5 which illustrates the circuitry to provide the work signal input to the logic and control circuit LC. This circuit includes a power integrator PI which monitors or senses the amount of electrical power which is consumed during a mixing operation. This is effected by deriving an electrical signal from the electrical energy employed to operate the motor 13, compensating that signal for the no-load operation of the apparatus, integrating the electrical signal with respect to time, and employing the integrated signal to actuate a digital indicator so that a reading is provided of the time integral of the electrical power consumed in mixing the elastomer. The indicating device preferably also includes a means which permits mixer discharge to be automaticlly performed when the time integral of the electrical power consumed reaches a predetermined value.

Referring now to FIG. 5, it will be seen that electrical power is supplied to the motor 13 for the operation of the rotors 12, from a suitable source of three phase, alternating electrical energy, through the power supply lines L1, L2 and L3, which are connectable with motor lads M1, M2 and M3 through a suitable disconnected switch 26. A watts transducer 27 is operatively connected to the motor supply leads M1, M2 and M3 to derive a signal representative of the power consumed by motor 13. The watts transducer 27 may be of conventional type as, for example, that sold under the trade name Halltiplier by Esterline Scientific Columbus, a division of the Esterline Corporation, of Columbus, Ohio, U.S.A.

The transducer 27 is connected to the motor leads M1, M2 and M3 by voltage transformers 28 and 29, and current transformers 30, 31. Thus, the primaries of transformers 28 and 29 are connected, respectively, between the motor leads M1, M2 and M2, M3, while the current transformer 30 and 31 are inductively associated with the motor leads M1 and M3, respectively. The secondaries of the transformers 28, 29 and 30, 31 are connected to the transducer terminals, as shown in FIG. 5, so that the latter produces an output signal through line 32 which is indicative of the electrical energy consumed by the motor 13. Typically, the current flow through the line 32 will be at a maximum of 100 millivolts, which, after amplification as hereinafter described, is equivalent to 100 kilowatts of energy consumed by the motor 13 so that each millivolt output of the transducer becomes equivalent to 1 kilowatt of energy consumed by the motor.

The amplification, integration and utilization of the electrical output signal from transducer 27 is effected through an electronic circuit, as hereinafter described, the power for which is derived from a conventional power supply.

The electrical signal from the transducer 27 passes through the line 32 to a buffer amplifier 34 from which the signal then travels through line 35 to a switch contact 36 and thence to an amplifier 37. The output of the amplifier 37 passes through line 38 to a digital voltmeter 39. The voltmeter 39 is of a commercially available type which, for example, may be one of the Series 270 sold by Newport Laboratories, Inc., of Santa Ana, Cal. This device not only provides a digital readout of the signal supplied to it but also includes a settable contact which can be made to operate when a predetermined reading is reached. This settable contact, in accordance with this invention, is connected with a line 40 extending to motor relay 41, which controls the operation of the motor 16 that in turn operates the closure member 15 for the discharge of the mixer. In addition, the line 40 is connected to a relay 42 which controls reset contact 43.

The line 35 is connected by a line 44 to a relay contact 45 that, when operated, closes the circuit through resistance 46 to an integrating amplifier 47 about which the aforementioned switch 42 is bridged. From the amplifier 47 the signal, which has now been integrated with respect to time, passes through one or the other of two range selecting resistors 48 and through a switch contact 49 to the aforementioned switch contact 36. From the switch contact 36, when the latter is moved from the position shown in FIG. 5 to its second circuit closing position, the integrated signal passes through the previously described amplifier 37 and line 38 to the digital voltmeter 39 which, as previously mentioned, is also connected with the relay 42 and the motor control relay 41.

The integrating amplifier 47 is adjusted to a time constant of appropriate amount for the specific application. In the operation herein specifically described the time constant is 3.6 seconds. Hence, since there is one millivolt of signal strength for each kilowatt of energy consumed by the motor 13, the integrated signal provided to the digital voltmeter is equivalent to the kilowatt hours of energy consumed by the mixer motor.

The circuit just described is such that operation of the mixer is initiated by closing the disconnect switch 26 thereby energizing the motor 13 through the motor leads M1, M2 and M3. Simultaneously, energy flows to the motor control relay 41 which at this time prevents flow of energy to the motor 16 so that the closure member 15 of the mixer is maintained in closed position. Closing of switch 26 results in the flow of electrical energy to the motor 13 causing a signal to flow from the watts transducer 27 through the line 32 to and through the amplifier 34. Operation of a switch 50 operates a relay 36a which closes the contact 36 connecting the output from amplifier 34 to amplifier 37 and from there to voltmeter 39 which provides a digital reading indicative of the energy in kilowatts consumed by the mixer motor when the mixer is operating empty or under a no-load condition. The operator then adjusts the wiper arm of a potentiometer 51a, connected with the input of the amplfier 34, to thereby compensate the signal coming from the watts transducer 27 so that the voltmeter 39 indicates a zero reading for the no-load or empty operation of the mixer.

The operator now sets the switch 50 to the "off" position and actuates a start switch 52. He then introduces the elastomer into the mixer, the ram or weight 19 of the latter being in the elevated position. The operation of switch 50 acts through relay 36a to move the contact 36 from the position shown in FIG. 5 to circuit closing relationship with the resistances 48 while actuation of the start switch 52 energizes relay 45a which moves contact 45 to circuit closing position. At this time the contact 43 is held open by the relay 42 and, hence, the signal coming from the watts transducer 27 is now integrated with respect to time and the digital reading thereof appears upon the dials of the voltmeter 39. The switch 49 permits a change of range for the voltmeter, if desired, as, for example, when employing the apparatus for very short mixing cycles.

During the mixing cycle the operator will, from time to time, add ingredients to the elastomer. The proper intervals for these additions can be precisely determined in accordance with the amount of energy expended in mixing the elastomer through observation of the readings upon the voltmeter. When such additions are made, the ram or weight 19 is elevated and, subsequent to an addition, the mixer may continue to operate with the ram elevated for a time after which the ram is again lowered to the position shown in FIG. 1 for additional mixing action.

When all of the ingredients have been added and mixing has been completed, as determined by the reading of the voltmeter, the operator may manually terminate the mixing cycle by opening switch 52 and actuating realy 42. This will de-energize relay 45a to open contacts 45, causing a ground signal to be supplied to the integrator terminating integration of the signal from the watts transducer 27. This manual termination of the cycle will cause relay 42 to move the contact 43 to the position shown in FIG. 5, resetting integrator amplifier 47 to zero. Also, energy is now supplied to the motor controller 41 thus operating motor 16 to move closure member 15 to the material discharging position. A new cycle may be resumed by again closing the switch 52, setting relay 42 and adding elastomer and ingredients as above described.

As aforementioned, the voltmeter 39 includes a contct which can be set for closing upon a predetermined reading of the voltmeter. This setting may be effected by adjustment of thumb-wheel switches on the voltmeter. When this feature is employed it is unnecessary for the operator to actuate relay 42 in order to discharge the material and reset the voltmeter since this will automatically occur when the predetermined reading is obtained on the meter.

The determination of the amount of mixing or working of the elastomer which should occur prior to and/or after the introduction of each of the ingredients, and the total length of mixing cycle is established by experimentation. This is effected by carefully observing the properties of compounded elastomers in which the various ingredients have been incorporated at selected intervals measured by predetermined consumptions of electrical energy. Having established the proper amount of energy required for mixing a batch of material with desired properties, subsequent batches of like size and composition of very uniform characteristics can be obtained by careful observation of the voltmeter reading during the mixing cycle and adding the ingredients upon the consumption of the requisite power as indicated by the meter 39.

The following example illustrates the way in which the method of this invention was employed to effect mixing of a 200 pound batch of elastomer, it being understood that the invention is not limited to the number of steps, the nature thereof or their sequence of operations as set forth herein. In this example, the second column provides the kilowatt hour readings on the meter 39 when the operation, indicated in the last column, is performed. The third column provides the energy requirements per pound for the operations performed for the composition of the example so that batches of like composition but of weight different than 200 pounds can be prepared.

| Step | KWH | Watt hrs./lb. | Operations |
|------|------|---------------|------------------|
| 1    | 0.00 | 0.00          | add polymers     |
| 2    | 0.50 | 2.50          | add carbon black |
| 3    | 3.60 | 18.00         | roll             |
| 4    | 4.00 | 20.00         | add oil          |
| 5    | 5.60 | 28.00         | roll             |
| 6    | 6.00 | 30.00         | add curatives    |
| 7    | 9.00 | 45.00         | dump and reset   |

The input to the logic and control circuit LC respecting the temperature of the material being worked may be derived in various ways. The embodiment described herein is in conjunction with a Banbury mixer as illustrated in FIG. 1. Consequently then, the temperature of the elastomer being worked may be determined by sensing the temperature within the mixing chamber 10 such as with a temperature sensing probe 59 suitably mounted, for example, on the ridge 14. The probe may take the form of a thermocouple having a pair of conductors (not shown in FIG. 1) extending to a temperature logic amplifier circuit 61 (FIG. 6) within the logic and control circuit LC. Circuit 61 processes the temperature signal and supplies BCD data respecting the temperature in degrees Fahrenheit to the printer control PC. It also includes a visual display TD for providing a visual readout to an operator.

The input to the logic and control circuit respecting the open or closed condition of door 15 may be obtained in various ways. In the embodiment disclosed herein a microswitch 60 is positioned so that as the door is driven to its open condition, as shown by the dotted lines in FIG. 2, switch 60 is actuated from a normal closed condition to an open condition.

The input to the logic and control circuit LC respecting the condition of ram 19 (FIG. 1) may be obtained in various ways. In the embodiment disclosed herein a microswitch 62 is position so as to be actuated to a switch closed position by an arm 64 extending from shaft 21 whenever ram 19 is in its down position, as shown by the solid lines in FIG. 1. Otherwise the switch is in an open condition indicative of a ram floating condition.

The printer control PC and printer PR may together take the form of what is conventionally known as a digital printer. One such printer is that known as the model 1454 digital printer readily available from the Beckman Corporation. Such a digital printer includes print control circuitry, data decoding circuitry and an output print mechanism. Digital data in a BCD format is supplied to the data decoder portions of the digital printer and, upon a print signal command, the print mechanism is operated to print the decoded information. A model 1454 digital printer is of the type known as a flying printer because a print drum rotates continuously during operation and printing is performed by a selected print hammer corresponding to a character disposed on the surface of the drum. Several columns of printing may be obtained. In the embodiment described herein the printing mechanism serves to print six columns of data along a horizontal line. With reference to FIG. 3 it will be noted that the six columns of data include time, with each line of print including characters designating hours, minutes, and seconds. The next column of data is a three-digit number representative of the compound identification. This is followed by a three-digit number representative of temperature in degrees Fahrenheit. Thereafter, the fourth data column includes a three-digit number representative of the batch number. The fifth column of data is a four-digit number representative of kilowatt hours. The last column of data includes a single alphanumeric character F, designating ram floating, or a character D, representing ram down.

A line of text is printed each time a print command is supplied from the logic and control circuit LC to the printer control PC. The first (lowest) line printed includes only a compound identification number and a batch number (columns 2 and 4). No information is printed on this line for clumns 1, 3, 5 and 6. During the printing of data respecting time, temperature, work and ram function no printout is made respecting compound identification and batch number. Whenever an operating condition is sensed such as door open or ram floating, a print command is supplied by the logic and control circuit LC to the printer control circuit PC which then prints the data in columns 1, 3, 5 and 6 for the then concurrent values of time, temperature and work and a ram function condition, if appropriate.

Referring now to FIG. 6, the printer control PC is illustrated as a block but including functional designations representative of various data decoder portions and control portions for operating the printer PR. More specifically, inputs to the data decoder portions of the printer control include BCD signals for data respcting compound identification, batch number, real time, temperature, and work. A column select signal is supplied dependent on the position of relay contacts K3B (see FIG. 6) for placing a command into logic section 70 or logic section 72. When the relay contacts K3B are in the position shown, a command signal is supplied to the printer control logic circuit 70 representative that the selected columns include columns 1 (time), 3 (temperature), 5 (work) and 6 (ram function). A printout will be made with these columns but no printout will be made for column 2 (command identification) or for column 4 (batch number). When the relay contracts are transferred, a command will be supplied to the printer control logic circuit 72 to select for printout only columns 2 (compound identification) and 4 (batch number). Selection of columns 2 and 4 also results in the printout being made in red ink rather than black ink.

As noted hereinbefore the printout for data will provide a designation D for ram down or F for ram floating when these conditions are sensed. However, no such designations are printed in response to a door closed condition or a door open condition. As will be discussed in greater detail hereinafter, relay contacts K1C and K2B serve to provide command inputs to printer control logic circuit portions 74 and 76 which serve to enable or disable the printing of these designations. Whenever a print command is supplied by the logic and control circuit to a print command logic circuit 78 in the printer control circuit PC, the printer control operates the printer to print characters in accordance with the BCD data supplied to the various data decoder portions but only for the selected columns in dependence upon the positioning of relay contacts K3B, K1C and K2B, discussed above.

During the printing operation itself, the printer control circuit PC provides an inhibit signal as an output to the logic and control for purposes of maintaining the status quo of certain needed parameters, to be discussed in greater detail hereinafter, during the printing operation. The printer control PC and printer PR of the embodiment disclosed herein may take the form of Beckman Model 1454 digital printed which is operative to provide the function discussed above in response to the BCD data and commands discussed above and also serves to provide an inhibit signal during a printing operation.

The operation of the data acquisition system will now be described in detail with particular reference to FIG. 6. The initial conditions may be taken as occurring when the mixer door 15 is in its open condition, the ram 19 is in its floating condition and the power integrator PI (FIG. 5) is in its reset mode. Consequently then, relay coil 42 is de-energized so that its relay contacts 82 are in the position shown in FIG. 6. This completes a circuit to energize relay coil K1. When this relay is energized all of its contacts transfer from the position shown in FIG. 6. Consequently then, relay contacts K1B are closed, completing a circuit to energize relay coil K3. Also, relay contacts K1A are transferred to their reset position and the K1C relay contacts are transferred to short circuit a capacitor 84. With capacitor 84 being short circuited, diodes 86 and 88 supply a ground or zero signal to the D logic circuit 74 and the F logic circuit 76 in the printer control PC. These signals inhibit printing of either the designation F or the designation D on the printout in the sixth column (see FIG. 3). Since relay coil K3 is energized, its contacts K3A are transferred to an open condition which, as will be described in greater detail hereinafter, prevents a ram position signal from causing a print command. Also with relay coil K3 being energized, its contact K3B are transferred so as to suppress printing of data for columns 1 (time), 3 (temperature) and 5 (work). The transferred K3B contacts, however, serve to select printing in columns 2 (compound identification number) and 4 (batch number) in red ink when a print command is provided.

With the data acquisition system in its initial condition as discussed above, it is conditioned to provide a printout showing only the compound identification number and the batch number in columns 2 and 4 respectively with the printout being in red ink. The operator may enter the compound identification number by adjusting each digit wheel of the thumb switch TH. In the example being given, the compound identification number is set as a three-digit number 333. A coded signal in BCD format is supplied by the thumb wheel switch TH to a data decoder portion of the printer control PC where the data is decoded for selection of the proper printout keys. Once a print command signal is supplied to the print logic circuit 78 of the printer control the printing mechanism will be indexed to column 2 to print out a three-digit line of text corresponding to 333.

With the compound number being entered with the thumb wheel switch TH, which also supplies a visual display of the entered number, the operator will now momentarily actuate a reset button 90. This supplies a ground signal or binary 0 signal to the reset input of a binary counter 92. This resets the counter to a count of one. A coded signal in BCD format representative of the count in counter 92 is supplied to a data decoder portion of the priner control PC so that the batch number count may be printed on the same line as the compound identification number but spaced therefrom in column 4. The prined batch number will be a three-digit number, in this case 001.

Actuation of the reset button 90 also provides a binary 0 signal which is applied to the clear input of a JK flip flop 94 causing this flip flop to exhibit a state in which its $\bar{Q}$ output carries a binary 1 signal to thereby energize a lamp 96. This lamp may be located on an operator's console and will be illuminated so long as flip flop 94 is in its clear state.

Actuation of the reset button 90 also supplies a binary 0 signal to one input of a six-input NAND gate 98. Normally each of the six inputs to the NAND gate exhibits a binary 1 condition and, hence, the output of the NAND gate normally exhibits a binary 0 condition. Whenever any one of the inputs to the NAND gate change from a binary 1 condition to a binary 0 condition the output of the NAND gate will change its state from the binary 0 condition to a binary 1 condition. Consequently, momentary actuation of the reset button 90 causes a momentary binary 0 condition to be provided on the output of the NAND gate 98. This is filtered by a low pass (550 KZ) filter 100. The filter may be comprised of a pair of NAND gates 102 and 104 connected together in series with a parallel resistor-capacitor circuit including resistor 106 and capacitor 108 connected from the input of NAND gate 102 to the output of NAND gate 104. The filtered binary 0 signal pulse is applied by the filter to the clock input of another JK flip flop 110. This causes its Q output circuit to change from its normal binary 0 level to a steady state binary 1 level. This binary 1 signal is, in turn, applied as one input to a two-input NAND gate 112. Once the second input to the NAND gate becomes a binary 1 signal the NAND gate will apply a binary 0 print command signal to the print input circuit 78 of the printer control PC.

Preferably the printing operation is synchronized with the operation of a clock CK. This is a digital clock and, for example, may take the form of the Beckman Corporation's Model 4050 digital clock. The clock provides an output signal each second to a one shot circuit 114 and also provides, in synchronization therewith, a coded signal in BCD format representative of real time in hours, minutes and seconds. This BCD signal is supplied to a data decorder portion of the printer control. Each time one shot circuit 114 is actuated by clock CK, it provides a binary 1 signal to the second input of the NAND gate 112 for a time period on the order of one millisecond. If, during this time, the Q output of flip flop 110 also supplies a binary 1 signal to the NAND gate, then the NAND gate will apply a binary 0 print command signal to the print logic circuit 78 of the printer control. This actuates the printer control to provide a printed readout. The readout will include only that information for which the printer control has been conditioned. Thus, with the relay contacts being positioned as discussed hereinbefore for initial conditions, the only data that is printed is that for the compound identification and the batch number and this printout is with red ink.

Whenever the printer control circuit receives a print command signal to initiate a printing operation its inhibit logic circuit 80 provides an inhibit output signal to prevent any change in status of data presented to the printer control and also to clear the print control flip flop 110. This inhibit signal is a binary 1 signal and is inverted by an inverter 120 which, in turn, applies a binary 0 signal to the clear input of flip flop 110. This causes the Q output of flip flop 110 to revert to its normal binary 0 signal level.

The first data readout after printing the compound identification and batch number takes place in response to the sensing that door 15 is in its closed condition. Information representative of a door closed condition may be obtained in various ways. In the embodiment illustrated, microswitch 60 is actuated to produce a binary 1 signal whenever the door is in its closed condition, as shown in the solid lines in FIG. 2. This causes relay coil 42 to be energized, resulting in transfer of its contacts 43 and 82 to the integrate mode. Consequently, relay contact 82 now applies a ground level or binary 0 signal through an OR gate 124 to enable a digital voltmeter 126. This is a conventional digital voltmeter and, for example, may take the form provided by Newport Corporation as their digital voltmeter Model No. 200B. This voltmeter serves to continuously receive the work output of the power integrator PI through the analog hold circuit 122 and provide a continuously changeable coded output signal in BCD format to the printer control. In addition, the level of work performed thus far during the cycle as metered by the digital voltmeter is displayed on the work display WD. This display may be an integral part of the digital voltmeter. The analog hold circuit will monitor the output of the integrator, unless actuated to a hold condition by one shot circuit 120. In such case, it will hold the last valve for 100 milliseconds. Voltmeter 126 continuously meters the output from the analog hold circuit 122, unless it receives an inhibit signal at its hold input H from the printer control PC. This signal is present during printing operations and actuates meter 126 to hold its output at a steady level until the printing operations are completed.

The temperature of the elastomer being worked is monitored by the temperature sensor 59, taking the form of a thermocouple, and which is coupled to a temperature logic amplifier and linearity control circuit, such as that provided by Doric Corporation as their temperature indicator Model DS500T3. This temperature indicator provides an output visual presentation as to the temperature in degrees Fahrenheit on the temperature display TD, which may be an integral part of the temperature indicator instrumentation, and also provides a coded output signal in BCD format, having a value representative of the temperature, for application to the printer control PC. This circuit also has a hold input H which is actuated by an inhibit signal from the priner control to hold its output signal at a steady level until the printing operations are completed.

At this point in time data for printing as to the values of work, temperature and time is presented to the printer control circuit. Actuation of relay 42 to the integrate mode breaks the circuit for relay coil K1 and when this coil becomes de-energized all of its contacts revert to the position as shown in FIG. 6. Moreover, a de-energization of relay coil K1 causes de-energization of relay coil K3 and all of its relay contacts revert to the position as shown in FIG. 6. However, as relay contact K3A reverts to the position shown in FIG. 6, it applies a binary 0 pulse to one input of the six-input NAND gate 98. This serves as a print command and NAND gate 98 applies a binary 1 print command through the low pass filter 100 to the clock input of flip flop 110. This causes the flip flop to change state so that its Q output carries a binary 1 signal. This print command from the Q output of flip flop 110 will be gated with a binary 1 signal from one shot 114 to provide a binary 0 print command signal to the print control circuit 78 to institute a printout. The text that will be printed at this point will include only the real time, temperature and work. The ram function designation D or designation F will not be printed. This is because as the relay contacts K1C open, capacitor 84 serves as a time delay so as to supply an inhibiting binary 0 signal to the D designation and F designation logic circuits 74 and 76, preventing printing of either one of these ram function designations.

After the first line of text for a door closed operation has been printed, the data acquistion system is conditioned to provide a readout each time the ram is sensed as being in either a ram down or a ram floating condition. If the ram is in a down position, then microswitch 62 is closed completing a circuit to energize relay coil K2. This causes all of the K2 relay contacts to transfer from the condition shown in FIG. 6. With relay contacts K2B being transferred, a binary 0 disabling signal is supplied to the F designation logic circuit 76 to prevent printing of that designation. Instead, the printer control PC will print designation D representative of ram down. A print command is obtained as the relay contact K2A transfers and supplies a momentary binary 0 signal to one input of the six input NAND gate 98. This causes a binary 1 signal to be supplied by the NAND gate through the low pass filter 100 to set flip flop 110 such that its Q output carries a binary 1 signal. This signal, in synchronism with the one shot circuit 114, is supplied to NAND gate 112 to provide a print command signal to the print command logic circuit 78 of the printer control. The printer will now print the second line of text showing real time, temperature and work in kilowatt hours performed thus far in the cycle, together with the designation D indicating that the ram is in a down condition.

Each time ram condition changes from a ram down condition to a ram floating condition, microswitch 62 changes from a closed condition to an open condition causing relay coil K2 to be de-energized. This causes relay contacts K2B to be transferred back to the position shown in FIG. 6 to disable printing of a D designation and enable printing of an F designation. Also with the K2A contacts returning to the position shown in FIG. 6, a momentary binary 0 signal is applied to one input of the six-input NAND gate 98. The NAND gate applies a binary 1 signal through the low pass filter to clock flip flop 110 so that its Q output applies a binary 1 signal to one input of the two-input NAND gate 112. In synchronism with clock, NAND gate 112 will then provide a print command to the print command logic circuit 98 so that the printer then prints out the third line of text (in the illustration of FIG. 3) showing real time, temperature in degrees Fahrenheit, elapsed work in terms of kilowatt hours thus far in the work cycle, and the designation F indicative that the ram is in a floating condition. In a given work cycle, the ram floating and ram down conditions may be repeated several times dependent upon the number of times that ingredients are added to the work chamber.

When the mixing cycle is completed door 15 is opened by motor 16. This may be accomplished by an operator actuating the motor so that it slides from the position shown in solid lines in FIG. 2 to that shown by the dotted lines. Also the door may be opened automatically in response to the work performed reaching a preset level causing the digital voltmeter 39 to provide an output signal to actuate the motor relay circuitry 41. This will complete a circuit so that motor 16 is energized to drive slide 15 to its door open condition. When the door is opened, microswitch 60 opens thereby de-energizing relay coil 42. Thus, its contacts 43 and 82 revert to the condition shown in FIG. 6. However, there is a 3 second time delay before these contacts change state. This action enables one shot circuit 120 to cause the analog hold circuit 122 to maintain the last reading of work and also causes the digital voltmeter 126 to be in a hold condition. As contacts 43 and 82 change state, relay coil K1 is energized causing its contacts K1A to transfer from the integrate (INT) position to the reset position (RST). This applies a momentary binary 0 signal to one input of the six-input NAND gate 98, causing a print command to be applied to the print command logic circuit 78. The printout will include only the then concurrent values of time, temperature and work. As relay contacts K1A transfer to the reset position they also apply a binary 0 signal to an input of a flip flop 124 causing its Q output to provide a binary 1 signal which is supplied to counter 92 as a count signal, causing the counter to increase its count by a factor of 1. This is displayed by the batch display BD as batch No. 002. This also causes a change in the $\overline{Q}$ output of flip flop 124 which applies a binary 0 signal to the clock input of flip flop 94, causing the $\overline{Q}$ output of that flip flop to revert to a binary 0 condition, thereby de-energizing lamp 96. This is the lamp that has been illuminated during the printing of the first batch in response to the operator actuating the reset button 90.

When the K1B relay contacts close a circuit is completed energizing relay coil K3. However, relay K3 is a time delay relay and a delay of approximately three seconds takes place after the K1B contacts close before the K3 relay contacts change state. After approximately three seconds have elapsed, the K3 contacts change state from that shown in FIG. 6. Once the K3B contacts have changed state, a binary 0 signal is supplied to enable the printing of only columns 2 and 4 in red ink so as to provide a printout of the compound identification and batch number. As the K3C contacts change state a binary 0 pulse is applied to one input of the six-input NAND gate 98, causing a print command to be supplied to the print logic circuit 98 causing a printout of the compound identification and batch number for the next cycle.

Although the invention has been described in conjunction with a preferred embodiment, it is apparent that various modifications and arrangements of parts may be made without departing from the spirit and scope of the present invention as defined by the appended claims.

Having described the invention, what is claimed is:

1. An apparatus comprising an elastomer processor having means for mechanical working elastomer according to a work cycle, electrically energized drive means for driving said working means such that electrical energy is expended as work is performed on said elastomer, means responsive to the flow of electrical energy to said drive means for providing an electrical signal indicative of the amount of energy consumed by said drive means, means for compensating said signal for the energy consumed by said processor when running without load, means for integrating said compensated signal with respect to time, means responsive to said integrated signal for providing a work signal having a value in accordance with the amount of expended electrical energy as the elastomer is being worked, means for sensing the temperature of the elastomer as it is being worked and providing electrical temperature signal having a value in accordance therewith, means for providing a time base signal, during the work cycle, having a value representative of time, and means for periodically providing a readout of the concurrent values of said time base, work and temperature signals.

2. Apparatus as set foth in claim 1, wherein said processor has a work processing condition and a non-processing condition, means for sensing said conditions and providing a first or a second condition signal in accordance with said conditions, said readout providing means including means responsive to said first and second condition signals to provide a readout for each said condition of the then concurrent values of said time signal, said temperature signal and said work signal.

3. Apparatus as set forth in claim 1, wherein said processor has a work chamber having a door which has a closed condition as work is being performed on the elastomer and is actuated to open condition to exit processed elastomer from said chamber, means for sensing said door conditions and providing a door closed signal when the door is closed and a door open signal when the door is open, said means for providing a readout including means responsive to a said door closed signal and a said door open signal to respectively provide a readout for each of said door conditions of the then concurrent values of said time signal, said temperature signal and said work signal.

4. Apparatus as set forth in claim 1, wherein said processor has a work chamber and a ram for communicating with said work chamber when in a ram down position and displaced therefrom when in a ram elevated condition, means for sensing said ram down and elevated conditions and providing a ram down signal and a ram elevated signal respectively representative of said conditions, said readout providing means including means responsive to said ram down signal and a said ram elevated signal for respectively providing a readout of the then concurrent values of said temperature signal, said work signal and said time signal.

5. Apparatus as set forth in claim 4, wherein said work chamber has a door which has a closed condition as work is being performed on the elastomer and is actuated to an open condition to exit processed elastomer from said chamber, means for sensing said door conditions and providing a door closed signal when the door is closed and a door open signal when the door is open, said means for providing a readout including means responsive to a said door closed signal and a said door open signal to respectively provide a readout for each of said door conditions of the then concurrent values of said time signal, said temperature signal and said work signal.

6. Apparatus as set forth in claim 5, wherein said readout means includes means responsive to a said ram down signal for providing a readout including a designation of said ram down condition together with the then concurrent values of said temperature signal, said work signal and said time signal.

7. Apparatus as set forth in claim 5, wherein said readout means includes means responsive to a said ram elevated signal for providing a said readout including a designation representative of said ram elevated condition as well as a readout of the then concurrent values of said temperature signal, said work signal and said time signal.

8. Apparatus as set forth in claim 1 wherein said processor includes an electrically controlled discharge member for discharging worked elastomer from said processor and means responsive to said work signal for controlling said electrically controlled discharge member to discharge said elastomer when a predetermined amount of electrical energy has been consumed in working said elastomer.

9. Apparatus for use with an elastomer processor having means for mechanically working elastomer according to a work cycle and electrically energized drive means for driving said working means such that electrical energy is expended as work is performed on said elastomer, said apparatus comprising means responsive to the flow of electrical energy to said drive means for providing an electrical signal indicative of the amount of energy consumed by said drive means, means for compensating said signal for the energy consumed by said processor apparatus when running without load, means for integrating said compensated signal with respect to time, means responsive to said integrated signal for providing a work signal having a value in accordance with the amount of expended electrical energy as the elastomer is being worked, means for sensing the temperature of the elastomer as it is being worked and providing an electrical temperature signal having a value in accordance therewith, and means for periodically providing a readout of the concurrent values of said work signal and said temperature signal.

10. Apparatus as set forth in claim 9 including means providing a time base signal during the work cycle having a value representative of time, said means for providing a readout of the concurrent values of said time base signal, said temperature signal, and said work signal.

11. Apparatus as set forth in claim 10, wherein said readout providing means includes means for providing a permanent record of said periodic readouts.

12. Apparatus as set forth in claim 11, wherein said readout providing means includes actuatable character forming means for, when actuated, forming characters along a character line on a said permanent record with said characters providing human readable information.

13. Apparatus as set forth in claim 12, wherein said character forming means includes actuatable printing means for, when actuated, printing a line of said characters on a said permanent record.

14. Apparatus as set forth in claim 12, including readout control means responsive to a command signal for actuating said character forming means to form a line of characters on a said record.

15. Apparatus as set forth in claim 14 wherein said readout control means includes means for receiving a plurality of groups of data signals, and group readout control means responsive to group selection signals for controlling said readout providing means to form selected groups of characters on said permanent record in accordance with said selection signals.

16. Apparatus as set forth in claim 15, including means for applying said temperature signal, said time signal and said work signal to readout control signal receiving means as one group of data signals.

17. Apparatus as set forth in claim 16, including mixture identification means for providing identification data signals as a second group of data signals for application to said readout control signal receiving means.

18. Apparatus as set forth in claim 17, including group selection means for supplying group selection signals selectively representative of said first or said second groups of data signals to said group readout control means so that when said character forming means is actuated it will form characters only for the selected group of data signals.

* * * * *

UNITED STATES PATENT OFFICE
CERTIFICATE OF CORRECTION

PATENT NO. : 3,999,046

DATED : December 21, 1976

INVENTOR(S) : JOHN P. PORTER

It is certified that error appears in the above-identified patent and that said Letters Patent are hereby corrected as shown below:

In Col. 4, line 11, "extend" should be --extent--.

In Col. 5, line 52, "commerce" should be --commence--.

In Col. 6, line 26, "automaticlly" should be --automatically--.

In Col. 7, line 19, "42" should be --43--;

In Col. 8, line 24, "realy" should be --relay--;

In Col. 9, line 44, "position" should be --positioned--.

In. Col. 10, line 18, "clumns" should be --columns--.

In Col. 11, line 8, "printed" should be --printer--; line 38, "contact" should be --contacts--; line 50, "thumb" should be --thumbwheel--.

UNITED STATES PATENT OFFICE
CERTIFICATE OF CORRECTION

Patent No. 3,999,046  Dated December 21, 1976

Inventor(s) John P. Porter  Page 2 of 2

It is certified that error appears in the above-identified patent and that said Letters Patent are hereby corrected as shown below:

In Col. 12, line 4, "prined" should be --printed--.

In Col. 13, line 53, "priner" should be --printed--.

Signed and Sealed this

Twenty-fourth Day of May 1977

[SEAL]

Attest:

RUTH C. MASON
Attesting Officer

C. MARSHALL DANN
Commissioner of Patents and Trademarks